United States Patent [19]

Tehrani et al.

[11] Patent Number: 5,552,330

[45] Date of Patent: Sep. 3, 1996

[54] RESONANT TUNNELING FET AND METHODS OF FABRICATION

[75] Inventors: Saied N. Tehrani, Scottsdale; Herbert Goronkin, Tempe; Jun Shen, Phoenix; Xiaodong T. Zhu, Chandler, all of Ariz.

[73] Assignee: Motorola, Schaumburg, Ill.

[21] Appl. No.: 386,171

[22] Filed: Feb. 9, 1995

Related U.S. Application Data

[62] Division of Ser. No. 209,788, Mar. 11, 1994, abandoned.

[51] Int. Cl.$^6$ .......................... H01L 21/265; H01L 21/20; H01L 21/44
[52] U.S. Cl. .............................. 437/39; 437/41; 437/126; 437/912; 437/175
[58] Field of Search .................................. 257/12, 20, 24, 257/25, 29, 183, 191, 192, 194, 195, 20, 24; 437/126, 132, 39, 41 CS, 40 CS, 912, 175

[56] References Cited

U.S. PATENT DOCUMENTS

| | | | |
|---|---|---|---|
| 5,021,857 | 6/1991 | Suehiro | 257/194 |
| 5,060,031 | 10/1991 | Abrokwah et al. | 257/192 |
| 5,105,241 | 4/1992 | Ando | 257/194 |
| 5,113,231 | 5/1992 | Söderström et al. | 257/25 |
| 5,302,840 | 4/1994 | Takikawa | 257/194 |

OTHER PUBLICATIONS

Appl. Phys. Lett. 51(19), 9 Nov. 1987, "Integration of a resonant-tunneling structure with a metal-semiconductor field-effect transistor" by Woodward et al., p. 1542–1544.

*Primary Examiner*—Mary Wilczewski
*Assistant Examiner*—Brian K. Dutton
*Attorney, Agent, or Firm*—Eugene A. Parsons

[57] ABSTRACT

A resonant tunneling FET including a heterostructure FET with a channel layer having a first current contact and a control contact operatively coupled thereto and a resonant tunneling device, including a quantum well layer sandwiched between barrier layers with a resonant tunneling layer affixed to an opposite side of one barrier layer, operably affixed to the heterostructure FET to form a second current contact. The resonant tunneling FET being constructed from a material system which allows the fabrication of additional devices on the same substrate.

15 Claims, 3 Drawing Sheets

RESONANT TUNNELING FET AND METHODS OF FABRICATION

This application is a division of prior application Ser. No. 08/209,788, filed Mar. 11, 1994, now abandoned.

FIELD OF THE INVENTION

The present invention pertains to heterojunction transistors and more specifically to resonant tunneling field effect transistors.

BACKGROUND OF THE INVENTION

A variety of resonant tunneling devices have been constructed and/or proposed in the literature. Examples of these structures are: a resonant tunneling emitter transistor; a hot electron transistor; and a quantum well resonant tunneling base transistor. One major problem is that all of these structures have a low peak-to-valley current ratio and are mostly functional at low temperatures. Further, it is difficult to contact theses structures (e.g. base, emitter, collector or gate, source, drain) without incurring unacceptable amounts of leakage current between contacts.

Resonant tunneling devices have a potential of replacing conventional transistors in some applications, such as logic circuits, if they can provide non-monotonic characteristics that can be utilized to build smaller logic circuits. The limiting factor currently in these structures is that they are being fabricated in exotic material systems that can not be combined with conventional technology.

Thus, there is a need to provide small resonant tunneling devices with non-monotonic characteristics, which can be combined with existing technologies.

It is a purpose of the present invention to provide a new and improved resonant tunneling field effect transistor.

It is another purpose of the present invention to provide a new and improved resonant tunneling field effect transistor which can be easily integrated with existing VLSI and ULSI technologies.

It is still another purpose of the present invention to provide a new and improved resonant tunneling field effect transistor which can be combined with existing technologies to provide high performance and smaller dies for logic circuits.

SUMMARY OF THE INVENTION

The above problems and others are substantially solved and the above purposes and others are realized in a resonant tunneling field effect transistor including a heterostructure field effect transistor having a channel layer with current and control contacts operatively coupled thereto and a resonant tunneling device operably affixed to the heterostructure field effect transistor and forming a second current contact, the resonant tunneling device including a quantum well layer sandwiched between barrier layers with a resonant tunneling layer affixed to an opposite side of one barrier layer.

In one embodiment the resonant tunneling layer of the resonant tunneling device is formed with a plurality of quantum state energy levels for providing a plurality of peaks in a transfer characteristic curve for the resonant tunneling device to form a logic type switching resonant tunneling field effect transistor.

The above problems and others are substantially solved and the above purposes and others are realized in one method of fabricating a resonant tunneling field effect transistor including the steps of providing a substrate with a relatively planar surface and forming a plurality of layers including a buffer layer on the planar surface of the substrate, a channel layer on the buffer layer, a supply layer on the channel layer, a conductive layer on the supply layer, an etch stop layer on the conductive layer, a first resonant tunneling layer on the etch stop layer, a first barrier layer on the resonant tunneling layer, a quantum well layer on the first barrier layer, a second barrier layer on the quantum well layer, and a second resonant tunneling layer on the second barrier layer. The method further includes forming an ohmic metal contact on the second resonant tunneling layer, selectively etching the second resonant tunneling layer, the second barrier layer, the quantum well layer, the first barrier layer and the first resonant tunneling layer to the etch stop layer, using a first etchant and the ohmic metal contact as a mask and selectively etching the etch stop layer to the conductive layer using a second etchant and the ohmic metal contact as a mask. An ohmic metal contact is then formed on the conductive layer. A gate contact area is then defined, the conductive layer in the gate contact area is selectively removed to expose a surface of the supply layer and a Schottky metal contact is formed on the exposed surface of the supply layer in the gate contact area.

The steps of the above method can be performed in a variety of different sequences and slightly different FETs can be performed by implanting impurities to form at least some of the terminals.

BRIEF DESCRIPTION OF THE DRAWINGS

Referring to the drawings wherein like characters indicate like parts throughout the various figures.

DESCRIPTION OF THE PREFERRED EMBODIMENTS

Figure 1:
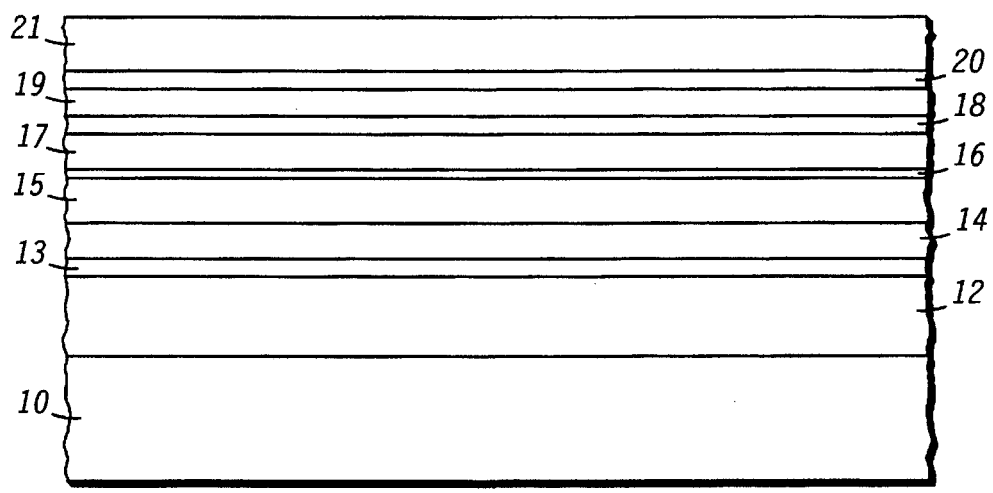
FIGS. 1 and 2 are simplified cross-sectional views of different structures in the fabrication of a resonant tunneling field effect transistor in accordance with the present invention.

Referring specifically to FIG. 1, a simplified cross-sectional view of a substrate 10 having a heterostructure of layers of material grown on a planar surface thereof is illustrated. While specific materials in a specific material system and specific layer thicknesses are utilized herein for example, it will be understood that some changes may be made without effecting the purpose herein described.

Substrate 10 is formed of semi-insulating gallium arsenide (GaAs). A buffer layer 12 of gallium arsenide (GaAs) is epitaxially grown on the planar surface thereof to reduce crystal stress in subsequent layers. A channel layer 13 of indium gallium arsenide (InGaAs) is epitaxially grown on the surface of buffer layer 12. A supply layer 14 of aluminum gallium arsenide (AlGaAs) is grown on the surface of channel layer 13. A relatively heavily doped contact layer 15 of GaAs is grown on the surface of supply layer 14. Layer 15 is doped, for example, with silicon ions or the like to a density of approximately $2 \times 10^{18}$ cm$^{-3}$ to provide relatively good conductivity, for reasons that will become apparent presently.

At this point several different methods of fabrication may be utilized, depending primarily on the sequence of the following steps. Thus, a first method of fabrication will be described with some possible variations in the sequence of steps explained later.

An etch stop layer 16 of gallium antimonide (GaSb) is grown on the surface of contact layer 15. A first resonant tunneling, or transition, layer 17 of indium arsenide (InAs) is grown on the surface of etch stop layer 16. A first relatively thin (approximately 15–25 angstroms) barrier layer 18 of AlSb is epitaxially grown on the surface of InAs resonant tunneling layer 17, followed by a quantum well layer 19 of GaSb (less than 100 angstroms thick and preferably approximately 65 angstroms), and, in turn, followed by a second relatively thin barrier layer 20 of AlSb. A second, relatively heavily doped, layer 21 of InAs is epitaxially grown on barrier layer 20 as a final layer. As will be explained in more detail presently, layer 21 may be formed as a resonant tunneling, or transition layer, depending upon the specific use of the resonant tunneling field effect transistor being fabricated. Also, the resonant tunneling layer could also be formed of graded InGaAs material to minimize the transition between GaAs layer 15 and GaSb layer 16 to minimize crystal dislocations and improve material reliability.

Figure 2:
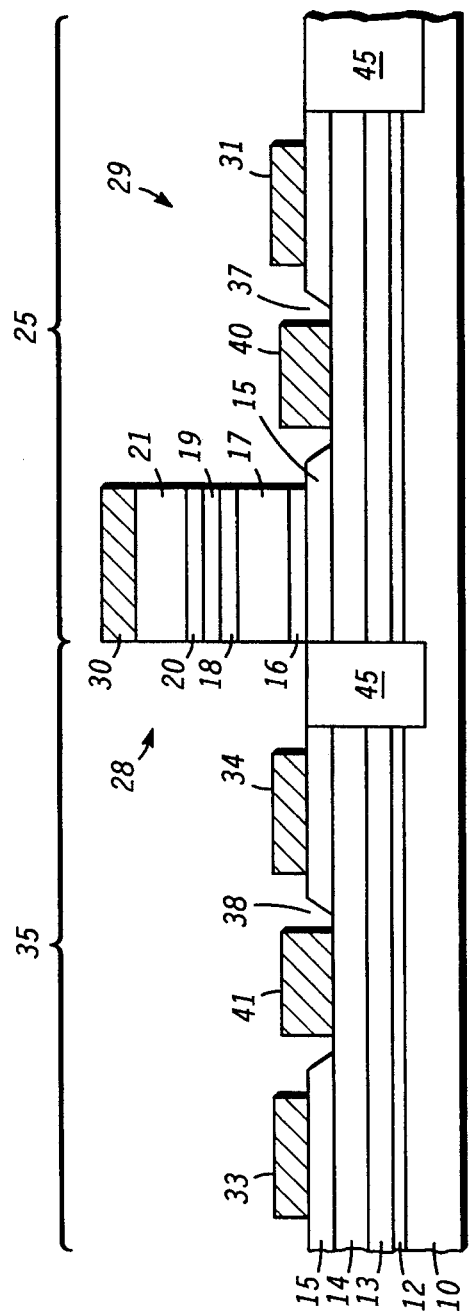

The structure of FIG. 1 is formed into a resonant tunneling field effect transistor (FET) 25, illustrated in FIG. 2, in a first fabrication method by etching and properly applying external contacts as follows. A first ohmic contact 30 is formed with final InAs layer 21, which contact serves as a drain, or in the alternative a source, for resonant tunneling FET 25. Using contact 30 as a mask, the upper layers, layers 21, 20, 19, 18 and 17 are etched down to etch stop layer 16. In a typical example, layer 21 is etched with a first solution of CH$_3$COOH:H$_2$O$_2$:H$_2$O in a ratio of approximately 5:1:5. Then layers 20, 19 and 18 are etched with a second solution of NH$_4$OH:H$_2$O in a ratio of approximately 10:1, after which layer 17 is etched down to etch stop layer 16 by again using the first solution. Etch stop layer 16 is then removed down to contact layer 15 using the second solution. The etched mesa formed by ohmic contact 30 and layers 21, 20, 19, 18 and 17 form a resonant tunneling device 28.

A second ohmic contact 31 is formed with heavily doped GaAs contact layer 15 by some convenient method. Ohmic contact 31 forms the source, or in the alternative, the drain, of resonant tunneling FET 25. At this point, other ohmic contacts 33 and 34 are made to other conventional FETs, represented by single FET 35. All of the contacts 30, 31, 33 and 34 are formed of some convenient metal system, such as nickel-gold-germanium (NiAuGe) which is applied by any convenient method, such as evaporation and lift-off. A gate contact area 37 for resonant tunneling FET 25 and a gate contact area 38 for conventional FET 35 are defined using some convenient method such as mask and photoresist. Heavily doped GaAs contact layer 15 is removed by etching or the like in gate contact areas 37 and 38 and Schottky metal contacts 40 and 41 are formed on the exposed upper surface of supply layer 14.

Ohmic metal contact 31 and Schottky metal contact 40, along with the area therebelow, form a heterostructure field effect transistor 29, which, when resonant tunneling device 28 is connected thereto, forms resonant tunneling FET 25. Resonant tunneling FET 25 and conventional FET 35 are separated or isolated from each other by any convenient method, such as deep resistive implants 45, which extend through layers 15, 14, 13 and at least into 12. Other isolation schemes including but not limited to deep etching, deep oxidation, etc. can be utilized, as will be understood by those skilled in the art.

Figure 3:
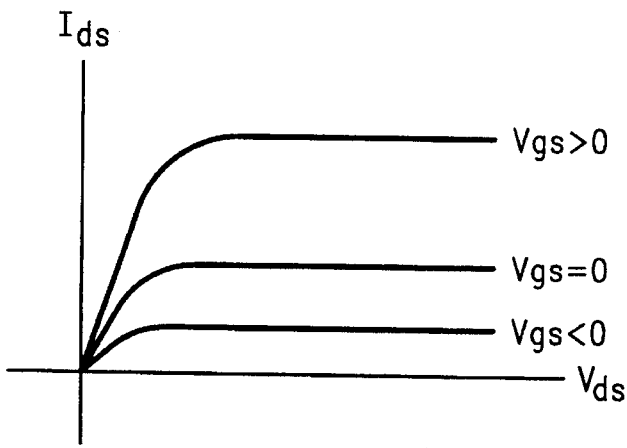
FIG. 3 is a graphic representation of the drain current-gate voltage characteristic of a heterostructure field effect transistor.

Referring specifically to FIG. 3, drain current versus drain-source bias curves for different gate voltages of a conventional depletion-mode FET are illustrated graphically. The curves illustrated are generally the transfer characteristic of FET 35, for example, in FIG. 2.

In resonant tunneling device 28 (see FIG. 2), the relatively narrow bandgap of InAs layer 21 is separated from the bandgap of GaSb quantum well layer 19 by the relatively large bandgap of barrier layer 20. Further, the bandgap of GaSb quantum well layer 19 is separated from the bandgap of InAs resonant tunneling layer 17 by the relatively large bandgap of barrier layer 18. Generally, barrier layers 18 and 20 have a relatively large bandgap to provide a barrier for the free flow of carriers thereacross but are formed very thin so that carriers can tunnel relatively easily between aligned energy bands. In this specific embodiment, GaSb quantum well layer 19 is formed sufficiently wide to allow a ground state quantized level in its valence band to be above the conduction band of InAs.

Figure 4:
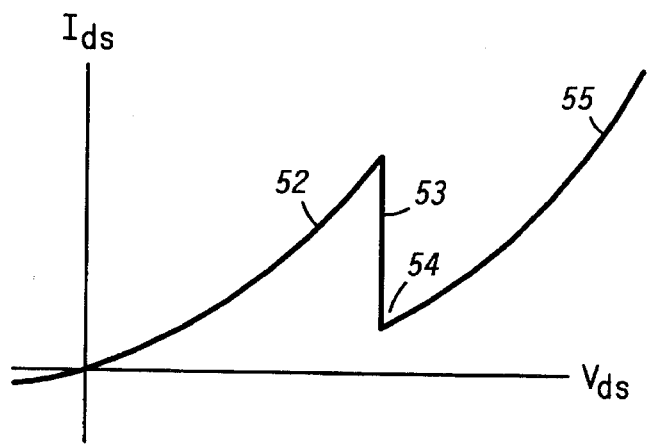
FIG. 4 is a graphic representation of the current-voltage characteristic of a resonant tunneling device.

By gradually applying a drain to source potential, $V_{ds}$, between contacts 30 and 31 the electrons in the InAs layer tunnel through the valence band energy states in GaSb layer 19. As this occurs, peak 52 in drain current, $I_{ds}$, occurs, generally as illustrated in FIG. 4. When additional potential $V_{ds}$ is applied, the electrons in the InAs layer are blocked by the band gap of GaSb layer 19 and $I_{ds}$ suddenly drops off, as illustrated at 53 in FIG. 4, to a valley 54. As the potential $V_{ds}$ is raised still further, the electrons in the InAs layer tunnel through the conduction band energy states of GaSb layer 19 and the current $I_{ds}$ begins to increase (55). In the present embodiment, relatively heavily doped InAs layers 21 and 17 are included to provide a low resistance access path for resonant tunneling device 28.

Figure 5:
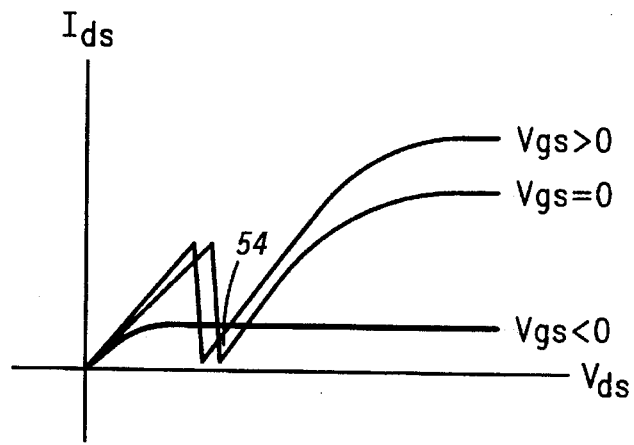
FIG. 5 is a graphic representation of the current-voltage characteristic of a resonant tunneling FET in accordance with the present invention.

Combining heterostructure FET 29 with resonant tunneling device 28, one obtains resonant tunneling FET 25. FIG. 5 illustrates the non-monotonic characteristics of resonant tunneling FET 25. If resonant tunneling FET 25 is a depletion-mode device, when $V_{gs}<0$, the maximum current through heterostructure FET 29 of resonant tunneling FET 25 is below that of the peak current of resonant tunneling device 28. Resonant tunneling device 28 acts like a load resistor at the source side of heterostructure FET 29 and $I_{ds}$ increases with $V_{ds}$ along a well known curve, as shown for $V_{gs}<0$ in FIG. 5. As for the case of $V_{gs}=0$, the maximum current of heterostructure FET 29 is higher than the peak current of resonant tunneling device 28. The total bias $V_{ds}$ is shared between resonant tunneling device 28 and heterostructure FET 29. As $V_{ds}$ is increased from zero, the bias across resonant tunneling device 28 is also increased, leading to an increased current through resonant tunneling device 28 and, thus, resonant tunneling FET 25. At a certain value of $V_{ds}$, resonant tunneling device 28 reaches its peak current and suddenly drops off to the much lower valley current (54 in FIG. 5). As $V_{ds}$ increases further, resonant tunneling device 28 acts again as a load resistor to heterostructure FET 29. As for the case of $V_{gs}>0$, heterostructure FET 29 is more conductive. As a result, the percentage of $V_{ds}$ on resonant tunneling device 28 is larger. It takes less value of $V_{ds}$ to reach the peak current of resonant tunneling device 28. Thus, it can be seen that resonant tunneling FET 25 has a substantially non-monotonic characteristic and could be used conveniently, for example, as a logic switching device.

In a somewhat different method of fabricating resonant tunneling FET 25 and conventional FET 35, substrate 10 is provided and layers 12 through 15 are grown as described above. Ohmic metal contacts 31, 33 and 34 are formed as described above and Schottky contacts 40 and 41 are formed as described above in whatever sequence is most convenient for the specific methods being utilized. A resonant tunneling device space is then defined, by masking and photoresist for example, and layers 17 through 21 are selectively grown on the defined space to form resonant tunneling device 28. Since the layers are not etched, as in the embodiment described above, an etch stop layer is not required. Ohmic metal contact 30 is formed on layer 21, as previously described, to complete resonant tunneling FET 25 and conventional FET 35. Again, some form of isolation 45 is provided at a convenient point in the method.

Figure 6:
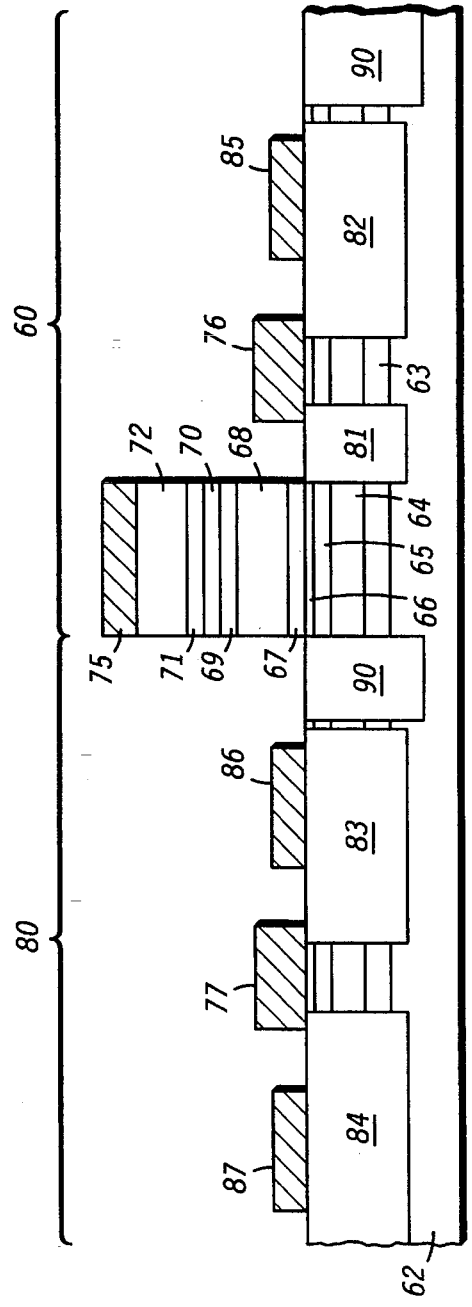
FIG. 6 is a simplified cross-sectional view of another resonant tunneling field effect transistor in accordance with the present invention.

Referring to FIG. 6, a simplified cross-sectional view of another resonant tunneling FET 60 is illustrated. In the fabrication of transistor 60, a substrate 62 is provided having a substantially planar surface. In the specific example to be described, substrate 62 is GaAs and an InAs/GaSb/AlSb material system is utilized for its convenience. A plurality of layers are sequentially epitaxially grown on each other including a buffer layer 63 of GaAs grown on substrate 62, a channel layer 64 of InGaAs is epitaxially grown on the surface of buffer layer 63, a supply layer 65 of AlGaAs is grown on the surface of channel layer 64, and a heavily doped contact layer 66 is grown on the surface of supply layer 65. Again at this point a divergence of methods, or the sequence of various steps, may occur.

In a first continuing method, an etch stop layer 67 of GaSb is grown on the surface of contact layer 66, a resonant tunneling layer 68 of InAs is grown on etch stop layer 67, a first barrier layer 69 of AlSb is grown on resonant tunneling layer 68, a quantum well layer 70 is grown on first barrier layer 69, a second barrier layer 71 of AlSb is grown on quantum well layer 70 and a contact layer 72 of InAs is grown on second barrier layer 71. An ohmic contact 75 is formed on contact layer 72 and utilized as a mask to etch through layers 72 to 68 down to etch stop layer 67, as previously described. Etch stop layer 67 is then etched using ohmic contact 75 as a mask. Schottky metal gate contacts 76 and 77 are then formed for resonant tunneling FET 60 and a conventional FET 80. Gate contacts 76 and 77, along with some other masking method such as photoresist, is utilized to implant areas 81 and 82 in resonant tunneling FET 60 and areas 83 and 84 in conventional FET 80. Resonant tunneling FET 60 is completed by forming ohmic contact 85 and conventional FET 80 is completed by forming ohmic contacts 86 and 87. Again some form of isolation 90 is utilized to separate resonant tunneling FET 60 from conventional FET 80.

In a slightly different sequence of steps, immediately subsequent to the growth of contact layer 66, Schottky metal gate contacts 76 and 77 are formed and implants 81, 82, 83 and 84 are made. Any necessary annealing steps can be performed at this time and the entire structure is covered with a mask layer (not shown), such as $Si_3N_4$. A window is then opened and layers 68 through 72 are selectively grown to form the resonant tunneling device. Ohmic contact 75 is formed on top of layer 72 as previously described, to complete resonant tunneling FET 60. Also, windows are opened to form ohmic contacts 85, 86 and 87 in contact with implants 82, 83 and 84, respectively.

The new and improved resonant tunneling FET has a substantial non-monotonic characteristic in the operation, as illustrated in the characteristic curve. Also, a new and improved resonant tunneling FET is disclosed which can be easily integrated with existing VLSI and ULSI technologies. The new and improved resonant tunneling field effect transistor is especially useful since it can be easily combined with existing technologies to provide high performance and smaller dies for logic circuits.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of fabricating a resonant tunneling field effect transistor comprising the steps of:

providing a substrate with a planar surface;

forming a plurality of layers including a buffer layer on the planar surface of the substrate, a channel layer on the buffer layer, a supply layer on the channel layer, a conductive layer on the supply layer, an etch stop layer on the conductive layer, a first resonant tunneling layer on the etch stop layer, a first barrier layer on the first resonant tunneling layer, a quantum well layer on the first barrier layer, a second barrier layer on the quantum well layer, and a second resonant tunneling layer on the second barrier layer;

forming a first ohmic metal contact on the second resonant tunneling layer;

selectively etching the second resonant tunneling layer, the second barrier layer, the quantum well layer, the first barrier layer and the first resonant tunneling layer to the etch stop layer, using the first ohmic metal contact as a mask and using a first etchant;

selectively etching the etch stop layer to the conductive layer using the first ohmic metal contact as the mask and using a second etchant;

forming a second ohmic metal contact on the conductive layer;

defining a gate contact area and selectively removing the conductive layer in the gate contact area to expose a surface of the supply layer; and forming a Schottky metal contact on the surface of the supply layer in the gate contact area.

2. The method of fabricating a resonant tunneling field effect transistor as claimed in claim herein the step of forming the plurality of layers includes growing the plurality of layers epitaxially.

3. The method of fabricating a resonant tunneling field effect transistor as claimed in claim 2 wherein the step of providing the substrate includes providing the substrate of semi-insulating GaAs and the step of forming the plurality of layers includes growing the buffer layer of GaAs, growing the channel layer of InGaAs, growing the supply layer of AlGaAs which is planar doped, growing the conductive layer of GaAs which is doped to provide n+-type conduction, and growing the etch stop layer of GaSb.

4. The method of fabricating a resonant tunneling field effect transistor as claimed in claim 3 wherein the step of growing the conductive layer of GaAs which is doped includes growing a layer of GaAs which is doped with silicon ions to a density of approximately $2\times10^{18}$ cm$^{-3}$.

5. The method of fabricating a resonant tunneling field effect transistor as claimed in claim 2 wherein the step of forming the plurality of layers includes growing the first resonant tunneling layer of one of InAs and graded InGaAs, growing the quantum well layer of GaSb and growing the second resonant tunneling layer of InAs.

6. The method of fabricating a resonant tunneling field effect transistor as claimed in claim 5 wherein the step of forming the first barrier layer includes growing a layer of AlSb.

7. The method of fabricating a resonant tunneling field effect transistor as claimed in claim 6 wherein the step of forming the second barrier layer includes growing a layer of AlSb.

8. The method of fabricating a resonant tunneling field effect transistor as claimed in claim 1 wherein the step of forming the quantum well layer of the resonant tunneling field effect transistor includes forming the quantum well layer with a plurality of quantum state energy levels for providing a plurality of peaks in a transfer characteristic curve for the resonant tunneling field effect transistor.

9. A method of fabricating a resonant tunneling field effect transistor and an associated field effect transistor comprising the steps of providing a substrate with a planar surface;

forming a plurality of layers including a buffer layer on the planar surface of the substrate, a channel layer on the buffer layer, a supply layer on the channel layer, a conductive layer on the supply layer, an etch stop layer on the conductive layer, a first resonant tunneling layer on the etch stop layer, a first barrier layer on the first resonant tunneling layer, a quantum well layer on the first barrier layer, a second barrier layer on the quantum well layer, and a second resonant tunneling layer on the second barrier layer;

forming a first ohmic metal contact on the second resonant tunneling layer;

selectively etching the second resonant tunneling layer, the second barrier layer, the quantum well layer, the first barrier layer and the first resonant tunneling layer to the etch stop layer, using the first ohmic metal contact as a mask and using a first etchant;

selectively etching the etch stop layer to the conductive layer using the first ohmic metal contact as the mask and using a second etchant;

forming a second ohmic metal contact on the conductive layer for the resonant tunneling field effect transistor and a plurality of additional ohmic contacts for an associated field effect transistor;

defining a gate contact area for the resonant tunneling field effect transistor and an additional gate contact area for the associated field effect transistor and selectively removing the conductive layer in the gate contact area and in the additional gate contact area to expose a surface of the supply layer in each of the gate contact area and the additional gate contact area; and forming Schottky metal contacts on the exposed surface of the supply layer in the gate contact area and in the additional gate contact area.

10. The method of fabricating a resonant tunneling field effect transistor and associated field effect transistors as claimed in claim 9 including in addition a step of isolating the resonant tunneling field effect transistor from the associated field effect transistor.

11. A method of fabricating a resonant tunneling field effect transistor comprising the steps of:

providing a substrate with a planar surface;

forming a plurality of layers including a buffer layer on the planar surface of the substrate, a channel layer on the buffer layer, a supply layer on the channel layer, a conductive layer on the supply layer, an etch stop layer on the conductive layer, a first resonant tunneling layer on the etch stop layer, a first barrier layer on the first resonant tunneling layer, a quantum well layer on the first barrier layer, a second barrier layer on the quantum well layer, and a second resonant tunneling layer on the second barrier layer;

forming a first ohmic metal contact on the second resonant tunneling layer;

selectively etching the second resonant tunneling layer, the second barrier layer, the quantum well layer, the first barrier layer and the first resonant tunneling layer to the etch stop layer, using a first etchant and the first ohmic metal contact as a mask;

selectively etching the etch stop layer to the conductive layer using a second etchant and the first ohmic metal contact as a mask;

defining a gate contact area on the surface of the conductive layer and forming a Schottky metal contact on the exposed surface of the conductive layer in the gate contact area;

defining a second contact area on the surface of the conductive layer at least partially using the first ohmic metal contact and the Schottky metal as a mask and implanting a dopant through the conductive layer, the supply layer, the channel layer and at least partially into the buffer layer; and forming an ohmic metal contact on the conductive layer in the second contact area in contact with the implanted dopant.

12. The method of fabricating a resonant tunneling field effect transistor as claimed in claim 11 wherein the step of implanting the dopant includes implanting a p-type dopant.

13. A method of fabricating a resonant tunneling field effect transistor and an associated field effect transistor comprising the steps of:

providing a substrate with a planar surface;

forming a plurality of layers including a buffer layer on the planar surface of the substrate, a channel layer on the buffer layer, a supply layer on the channel layer, a conductive layer on the supply layer, an etch stop layer on the conductive layer, a first resonant tunneling layer on the etch stop layer, a first barrier layer on the first resonant tunneling layer, a quantum well layer on the first barrier layer, a second barrier layer on the quantum well layer, and a second resonant tunneling layer on the second barrier layer;

forming an ohmic metal contact on the second resonant tunneling layer;

selectively etching the second resonant tunneling layer, the second barrier layer, the quantum well layer, the first barrier layer and the first resonant tunneling layer to the etch stop layer, using a first etchant and the ohmic metal contact as a mask;

selectively etching the etch stop layer to the conductive layer using a second etchant and the ohmic metal contact as a mask;

defining a gate contact area for the resonant tunneling field effect transistor and an additional gate contact area for the associated field effect transistor and forming Schottky metal contacts in the gate contact area and in the additional gate contact area;

defining a second contact area of the resonant tunneling field effect transistor and a plurality of contact areas for the associated field effect transistor on the surface of the conductive layer and implanting a dopant through the conductive layer, the supply layer, the channel layer and at least partially into the buffer layer in the second contact area and the plurality of contact areas; and forming an ohmic metal contact on the conductive layer in contact with the implanted dopant in the second contact area for the resonant tunneling field effect transistor and a plurality of additional ohmic contacts on the conductive layer in contact with the implanted dopant in each of the plurality of contact areas for an associated field effect transistor.

14. The method of fabricating a resonant tunneling field effect transistor as claimed in claim 13 wherein the step of implanting the dopant includes implanting a p-type dopant.

15. A method of fabricating a resonant tunneling field effect transistor comprising the steps of:

providing a substrate with a planar surface;

forming a plurality of layers including a buffer layer on the planar surface of the substrate, a channel layer on the buffer layer, a supply layer on the channel layer and a conductive layer on the supply layer;

forming a first ohmic metal contact on a first contact area of the conductive layer;

defining a gate contact area and selectively removing the conductive layer in the gate contact area to expose a surface of the supply layer;

forming a Schottky metal contact on the surface of the supply layer in the gate contact area;

defining a second contact area on the conductive layer;

forming a first resonant tunneling layer on the conductive layer, a first barrier layer on the resonant tunneling layer, a quantum well layer on the first barrier layer, a second barrier layer on the quantum well layer, and a second resonant tunneling layer on the second barrier layer in the second contact area; and forming a second ohmic metal contact on the second resonant tunneling layer.

* * * * *

UNITED STATES PATENT AND TRADEMARK OFFICE
CERTIFICATE OF CORRECTION

PATENT NO. : 5,552,330
DATED : September 3, 1996
INVENTOR(S) : Saied N. Tehrani     Herbert Goronkin
               Jun Shen          X. Theodore Zhu It is certified that error appears in the above-indentified patent and that said Letters Patent is hereby corrected as shown below:

Claim 2, column 6, line 53,
Delete "herein" and insert --1 wherein-- therefor.

Signed and Sealed this

Sixteenth Day of September, 1997

Attest:

BRUCE LEHMAN

Attesting Officer      Commissioner of Patents and Trademarks